United States Patent
Chiang

(10) Patent No.: US 10,314,194 B1
(45) Date of Patent: Jun. 4, 2019

(54) EXPANSION MODULE OF PROGRAMMABLE LOGIC CONTROLLER

(71) Applicant: DELTA ELECTRONICS, INC., Taoyuan (TW)

(72) Inventor: Tzu-Tsung Chiang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/954,496

(22) Filed: Apr. 16, 2018

(30) Foreign Application Priority Data

Jan. 16, 2018 (CN) .................... 2018 2 0071178 U

(51) Int. Cl.
H05K 7/14 (2006.01)
H05K 5/00 (2006.01)

(52) U.S. Cl.
CPC ......... H05K 7/1475 (2013.01); H05K 5/0065 (2013.01); H05K 5/0069 (2013.01); H05K 7/1465 (2013.01); H05K 7/1472 (2013.01); H05K 7/1474 (2013.01)

(58) Field of Classification Search
CPC .. H05K 7/1475; H05K 7/1478; H05K 7/1465; H05K 7/1468; H05K 7/1474; H05K 7/1472; H05K 5/0065; H05K 5/0069
See application file for complete search history.

(56) References Cited

U.S. PATENT DOCUMENTS

| 4,558,914 | A | * | 12/1985 | Prager | H05K 7/1441 361/679.4 |
| 4,597,291 | A | * | 7/1986 | Motomiya | H05K 7/1478 361/736 |
| 5,541,810 | A | * | 7/1996 | Donhauser | G05B 19/054 361/679.41 |
| 6,038,130 | A | * | 3/2000 | Boeck | H01R 9/2675 361/729 |
| 6,147,877 | A | * | 11/2000 | Strandberg | H01R 9/2408 361/679.4 |
| 6,456,495 | B1 | * | 9/2002 | Wieloch | H05K 7/1468 312/215 |
| 2010/0124029 | A1 | * | 5/2010 | Gaub | G05B 19/042 361/736 |

(Continued)

Primary Examiner — James Wu
(74) Attorney, Agent, or Firm — Kirton McConkie; Evan R. Witt

(57) ABSTRACT

An expansion module of a programmable logic controller is provided. The expansion module comprises a function body and an expansion base. The function body comprises a housing, a circuit board and a first connector. The circuit board is disposed in the housing. The first connector is connected with the circuit board and is partially exposed from the housing. The expansion base is detachably assembled with the function body and comprises a bracket and a three-way connector. The three-way connector is detachably disposed in the bracket and comprises three conducting terminals. The first conducting terminal and the second conducting terminal are at least partially exposed from the bracket. The third conducting terminal is configured to connect with the first connector. When there are plural expansion modules, two adjacent function bodies can be detachably assembled with each other, and two adjacent expansion bases can be detachably assembled with each other.

11 Claims, 11 Drawing Sheets

(56) References Cited

U.S. PATENT DOCUMENTS

2015/0362901 A1* 12/2015 Shimizu ................ G05B 19/05
                                                                                  700/9
2016/0029505 A1* 1/2016 Nomoto ............... H05K 5/0021
                                                                               312/223.1

\* cited by examiner

EXPANSION MODULE OF PROGRAMMABLE LOGIC CONTROLLER

CROSS-REFERENCE TO RELATED APPLICATION

This application claims priority to China Patent Application No. 201820071178.9, filed on Jan. 16, 2018, the entire content of which is incorporated herein by reference for all purposes.

FIELD OF THE DISCLOSURE

The present disclosure relates to an expansion module, and more particularly to an expansion module of a programmable logic controller.

BACKGROUND OF THE DISCLOSURE

Generally, the programmable logic controller needs the expansion module for expansion when the number of the control points of the CPU (Central Processing Unit) module is insufficient or the programmable logic controller requires additional function. The expansion module is in communication with the CPU module. Based on the connection way between the expansion module and the CPU module, the programmable logic controller can be classified into the programmable logic controller with serial connection structure or the programmable logic controller with parallel connection structure.

As regards the programmable logic controller with serial connection structure, the first expansion module is connected with the CPU module in series, and the follow-up expansion module is connected with the preceding expansion module sequentially. As for the programmable logic controller with parallel connection structure, the expansion modules and the CPU module are connected in parallel. Even if any of the expansion modules is removed, the communication and the power transmission among the remaining expansion modules and the CPU module are not affected, and the situation of signal interruption could not happen. There are two approaches of the programmable logic controller with parallel connection structure. Firstly, the programmable logic controller includes a base module having a plurality of base connectors, and connectors are mounted on the CPU module and the expansion modules respectively. By the connection between the base connector and the corresponding connector, the CPU module and the expansion modules are assembled with the base module respectively. Secondly, the programmable logic controller includes a rail-type base with copper rail, and plural connectors are mounted on the CPU module and the expansion modules respectively. By the connection between the copper rail and the connector, the CPU module and the expansion modules are assembled with the rail-type base respectively.

However, the programmable logic controller with serial connection structure still has some drawbacks. In case that any of the expansion modules is broken or is removed as required, the expansion modules serially connected therewith are interrupted from receiving the signal and power. Under this circumstance, the CPU module can't communicate with and control the interrupted expansion modules, and a part of the programmable logic controller stops working. Thus, for example, the temperature control may be lost and the sensors may be disabled, which causes the increasing loss, the decreasing activation and even safety anxiety.

In addition, the programmable logic controller with parallel connection structure also has some drawbacks. For the first approach, the base module can't be expanded. The number of expansion modules is limited by the number of base connectors, which reduces the applicability. Moreover, the base module includes a bracket, a circuit board and a plurality of base connectors, and the construction cost is high. For the second approach, the rail-type base can't be expanded or extended. The number of expansion modules is limited by the length of copper rail, which decreases the applicability. Moreover, the rail-type base is a complex structure base with a bracket and plural copper bars, and the construction cost is high. Furthermore, the exposed copper bar may be short-circuited by the broken copper wire or the tool, and thus breaks the modules.

Therefore, there is a need of providing an expansion module of a programmable logic controller in order to overcome the above drawbacks.

SUMMARY OF THE DISCLOSURE

An object of the present invention provides an expansion module of a programmable logic controller. The function body and the expansion base of the expansion module are detachably assembled with each other. The adjacent expansion modules are detachably assembled with each other via the expansion bases thereof, and the base module or the base is no longer needed. Consequently, the number of expansion module is unlimited, which enhances the applicability and decreases the cost, and it is flexible to expand or remove the expansion module during the function variation and the maintenance of the programmable logic controller.

Another object of the present invention provides an expansion module of a programmable logic controller. The serial connections and the parallel connections among the expansion modules can be adjusted freely. By removing the function body and expansion base assembled with each other, the serial connections among the expansion modules are adjusted. Alternatively, by removing the function body alone and keeping the corresponding expansion base connected with the adjacent expansion bases, the parallel connections among the expansion modules are adjusted.

In accordance with an aspect of the present invention, there is provided an expansion module of a programmable logic controller. The expansion module comprises a function body and an expansion base. The function body comprises a housing, a circuit board and a first connector. The circuit board is disposed in the housing. The first connector is connected with the circuit board and is partially exposed from the housing. The expansion base is detachably assembled with the function body and comprises a bracket and a three-way connector. The bracket comprises a first sidewall and a second sidewall opposite to the first sidewall. The first sidewall comprises a first opening, and the second sidewall comprises a second opening. The three-way connector is detachably disposed in the bracket and comprises a first conducting terminal, a second conducting terminal and a third conducting terminal. The first conducting terminal is at least partially exposed from the bracket through the first opening. The second conducting terminal is at least partially exposed from the bracket through the second opening. The third conducting terminal is configured to connect with the first connector. When there are plural expansion modules, two adjacent function bodies can be detachably assembled with each other, and two adjacent expansion bases can be detachably assembled with each other.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
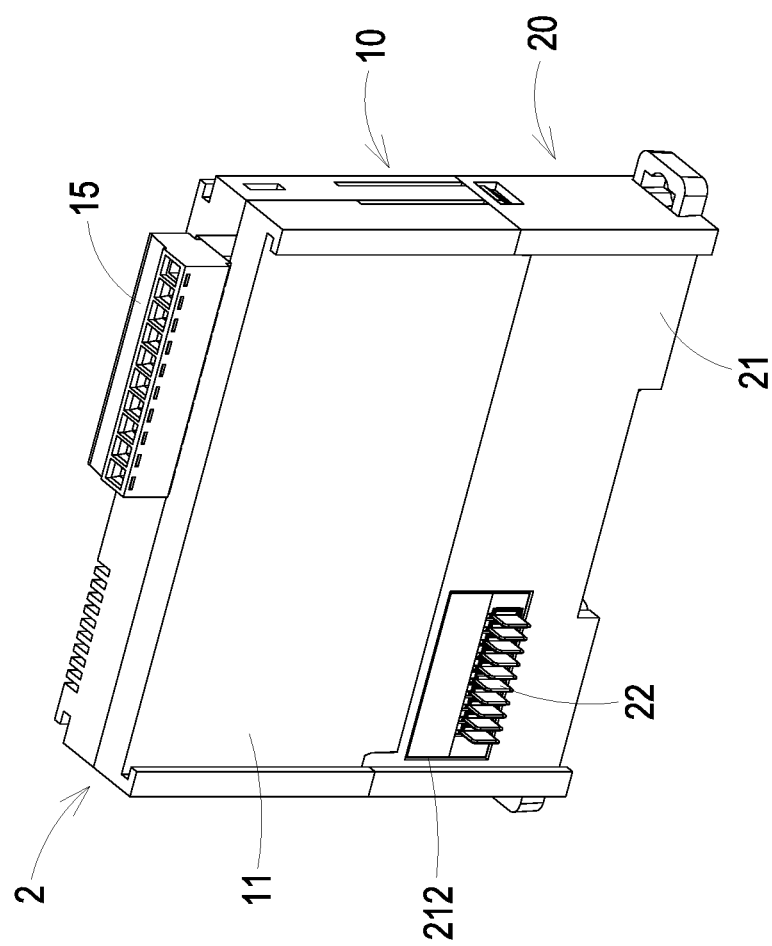
FIG. 1 is a schematic perspective view illustrating an expansion unit of a programmable logic controller according to an embodiment of the present disclosure.
Figure 2A:
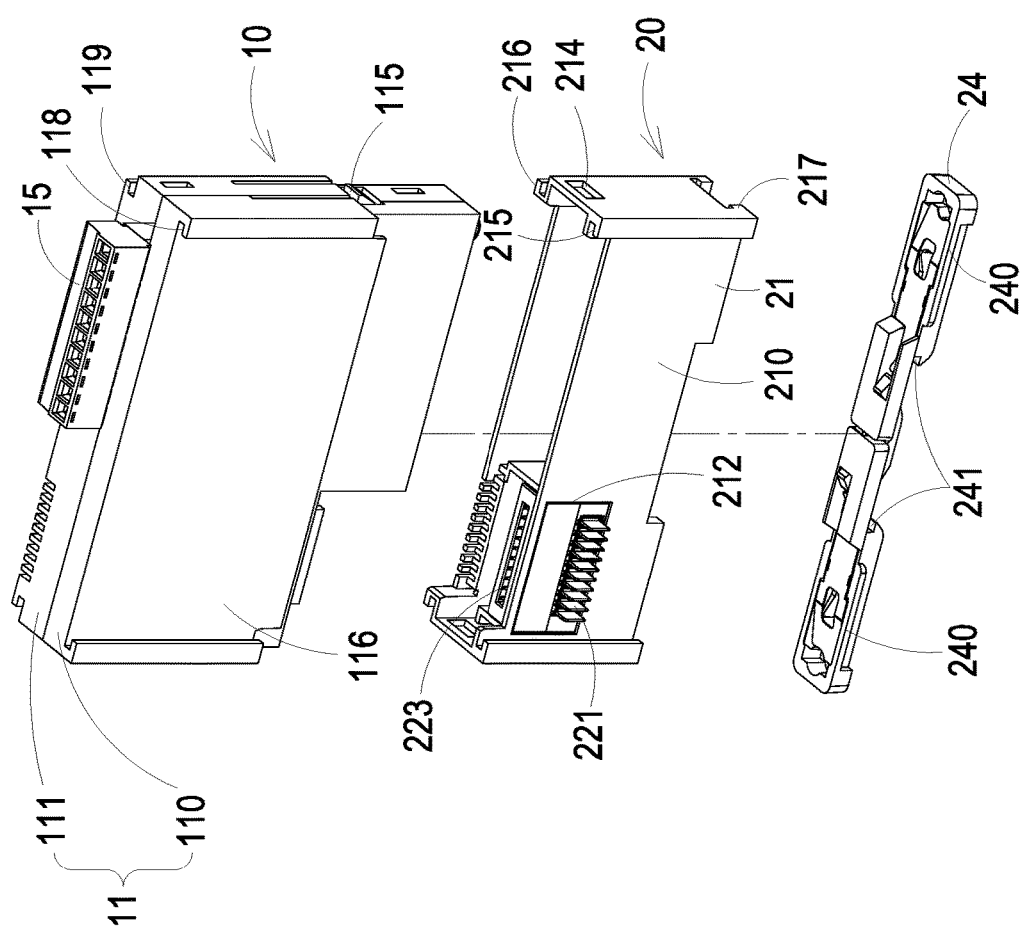
FIG. 2A is a schematic perspective view illustrating the function body and the expansion base of FIG. 1.
Figure 2B:
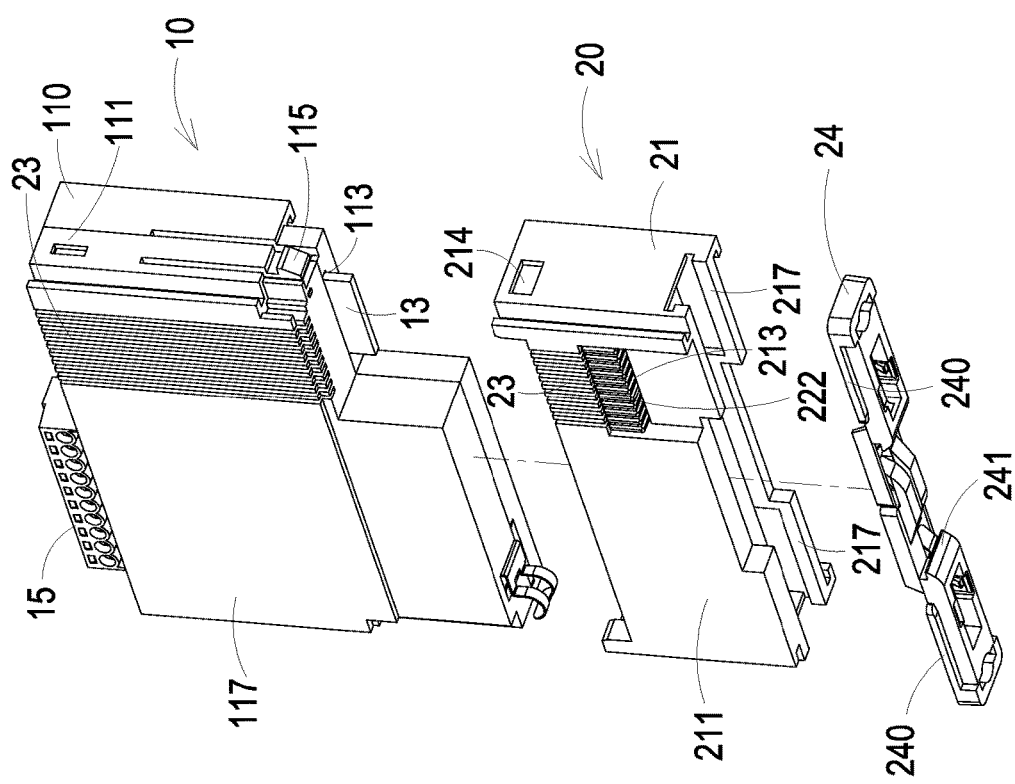
FIG. 2B is a schematic perspective view illustrating the function body and the expansion base of FIG. 2A at another viewing angle.
Figure 3:
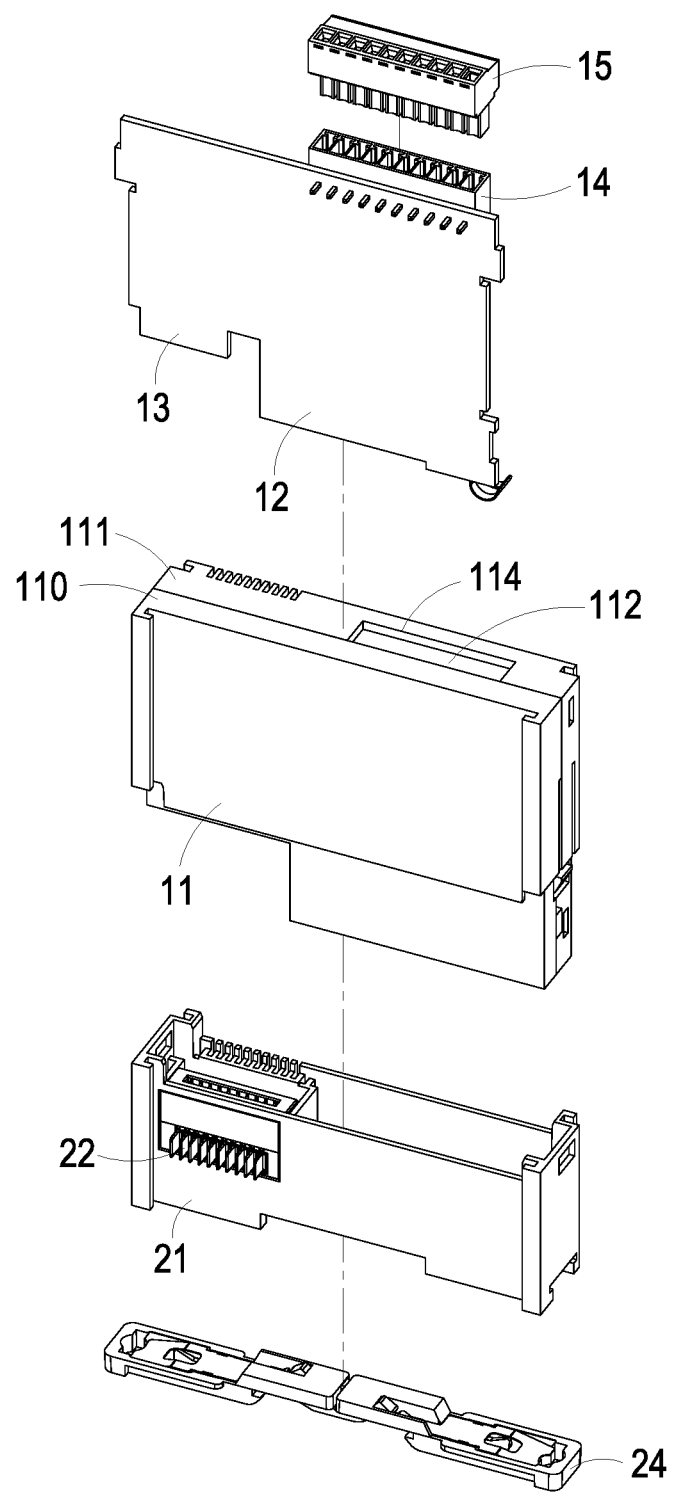
FIG. 3 is an exploded view showing the expansion module of FIG. 1.

FIG. 1 is a schematic perspective view illustrating an expansion unit of a programmable logic controller according to an embodiment of the present disclosure, FIG. 2A is a schematic perspective view illustrating the function body and the expansion base of FIG. 1, FIG. 2B is a schematic perspective view illustrating the function body and the expansion base of FIG. 2A at another viewing angle, and FIG. 3 is an exploded view showing the expansion module of FIG. 1. As shown in FIGS. 1, 2A, 2B and 3, the expansion unit 1 includes at least one expansion module 2, and every expansion module 2 includes a function body 10 and an expansion base 20.

The function body 10 includes a housing 11, a circuit board 12 and a first connector 13. The housing 11 has a first aperture 113. The circuit board 12 is disposed in the housing 11. The first connector 13 is connected with the circuit board 12 and partially exposed from the housing 11 through the first aperture 113. The housing 11 is for example but not limited to be constructed of a first component 110 and a second component 111. The first component 110 and the second component 111 are assembled together to define an interior space 112 for accommodating the circuit board 12.

In an embodiment, the function body 10 includes a second connector 14 and an I/O (input/output) unit 15. The housing 11 has a second aperture 114. The second connector 14 is connected with the circuit board 12 and aligned with the second aperture 114. The I/O unit 15 is connected with the second connector 14 through the second aperture 114.

Figure 4A:
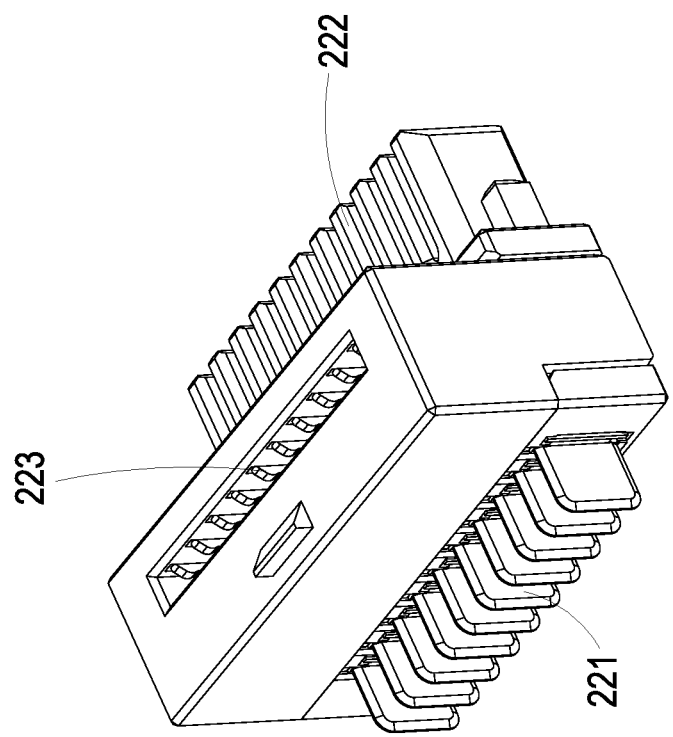
FIG. 4A is a schematic perspective view illustrating the three-way connector of FIG. 1.

The expansion base 20 includes a bracket 21 and a three-way connector 22. The three-way connector 22 is detachably disposed in the bracket 21. The bracket 21 has a first sidewall 210 and a second sidewall 211, and the first sidewall 210 is opposite to the second sidewall 211. The first sidewall 210 has a first opening 212, and the second sidewall 211 has a second opening 213. The three-way connector 22 includes a first conducting terminal 221, a second conducting terminal 222 and a third conducting terminal 223, which are in communication with each other. The first conducting terminal 221 is at least partially exposed from the first sidewall 210 of the bracket 21 through the first opening 212. The second conducting terminal 222 is at least partially exposed from the second sidewall 211 of the bracket 21 through the second opening 213. The third conducting terminal 223 is configured to connect with the first connector 13. Consequently, the power and signal transmission between the function body 10 and the expansion base 20 is realized. As shown in FIG. 4A, preferably but not exclusively, the third conducting terminal 223 is a socket structure.

In an embodiment, the housing 11 of the function body 10 includes at least one first fixing element 115, and the bracket 21 of the expansion base 20 includes at least one second fixing element 214. For example, as shown in FIGS. 2A and 2B, there are two first fixing elements 115 located at two opposite sides of the housing 11 respectively, and there are two second fixing elements 214 located at two opposite sides of the bracket 21 respectively. The first fixing element 115 is corresponding to the second fixing element 214. In case of assembling the function body 10 with the expansion base 20, the first fixing element 115 is engaged with the corresponding second fixing element 214, so that the function body 10 is securely assembled with the expansion base 20. The specific structures of the first fixing element 115 and the second fixing element 214 are not restricted. For example, as shown in FIGS. 2A and 2B, the first fixing element 115 and the second fixing element 214 are a protrusion and a recess respectively, so that the first fixing element 115 and the second fixing element 214 can be engaged with each other. Whereas, in an embodiment, the first fixing element 115 and the second fixing element 214 are the recess and the protrusion respectively, but not exclusively.

Figure 4B:
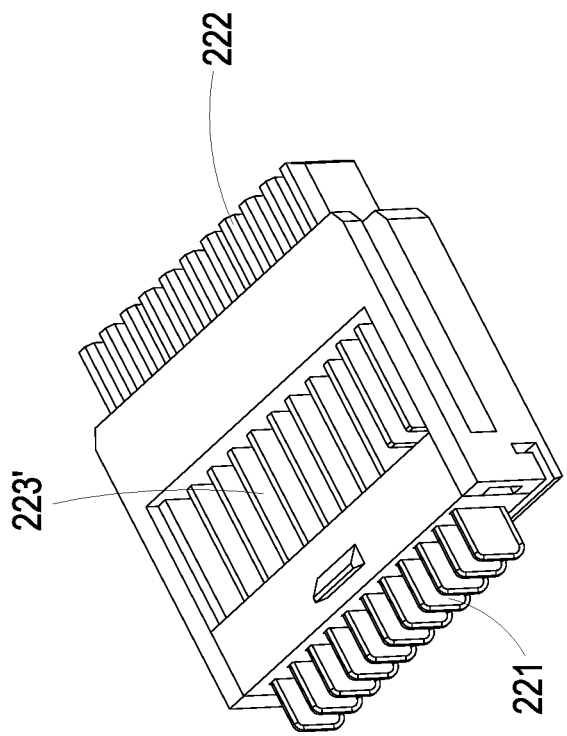
FIG. 4B is a schematic perspective view illustrating another example of the three-way connector of FIG. 1.

FIG. 4B is a schematic perspective view illustrating another example of the three-way connector of FIG. 1. In an embodiment, the three-way connector 22 (as shown in FIG. 4A) is changed to the three-way connector 22' shown in FIG. 4B. The component parts and elements similar to the three-way connector 22 of FIG. 4A are designated by identical numeral references, and are not redundantly described herein. Meanwhile, the three-way connectors 22 and 22' are disposed in the same place of the bracket 21. In comparison with the three-way connector 22 of FIG. 4A, the third conducting terminal 223' of the three-way connector 22' of FIG. 4B is a clip-type structure.

Figure 5:
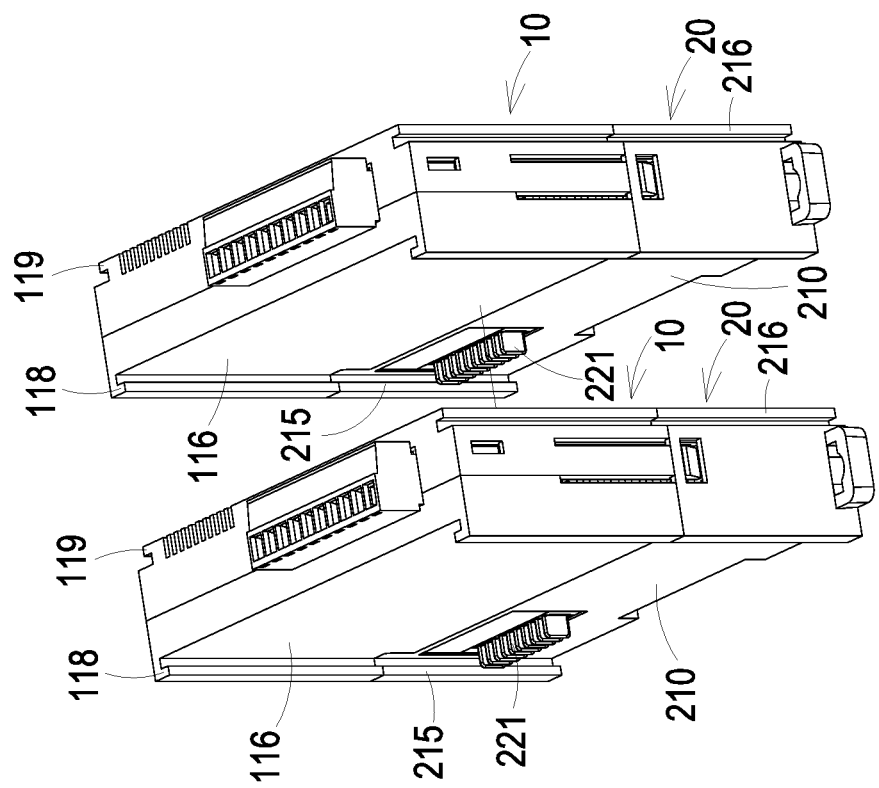
FIG. 5 is a schematic perspective view showing two expansion modules of FIG. 1.
Figure 6:
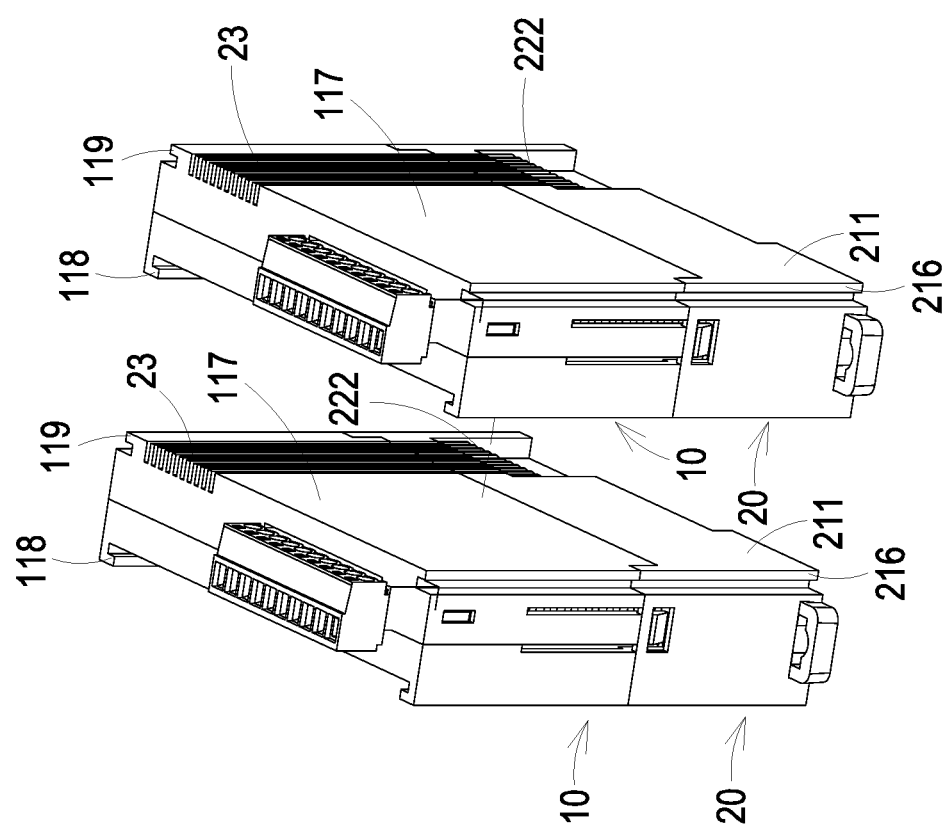
FIG. 6 is a schematic perspective view showing the two expansion modules of FIG. 5 at another viewing angle.
Figure 7:
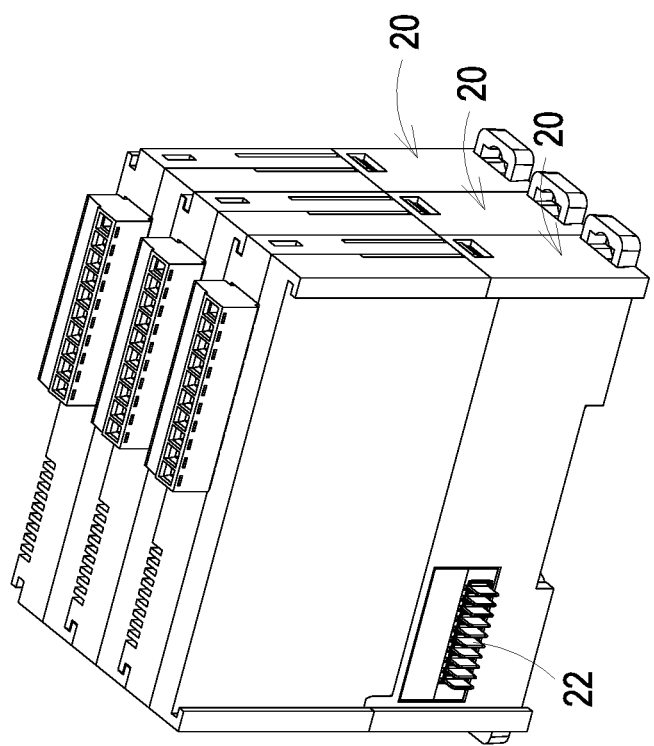
FIG. 7 is a schematic perspective view showing three expansion modules of FIG. 1 assembled with each other.

FIG. 5 is a schematic perspective view showing two expansion modules of FIG. 1, FIG. 6 is a schematic perspective view showing the two expansion modules of FIG. 5 at another viewing angle, and FIG. 7 is a schematic perspective view showing three expansion modules of FIG. 1 assembled with each other. As shown in FIGS. 5 and 6, two adjacent function bodies 10 can be assembled with each other, and two adjacent expansion bases 20 can be assembled with each other. Namely, two adjacent expansion modules 2 can be assembled with each other. When two adjacent expansion bases 20 are assembled with each other, the first conducting terminal 221 of the three-way connector 22 of one expansion base 20 is connected with the second conducting terminal 222 of the three-way connector 22 of the other expansion base 20. Therefore, the power and signal transmission between two adjacent expansion bases 20 is realized. As shown in FIG. 7, by the connections between the three-way connectors 22, one expansion base 20 can be assembled with two expansion bases 20 near the first sidewall 210 and the second sidewall 211 thereof respectively.

In an embodiment, as shown in FIGS. 2A, 2B, 5 and 6, the bracket 21 of the expansion base 20 includes two first engaging elements 215 and two second engaging elements 216. Two first engaging elements 215 are disposed on the two opposite side edges of the first sidewall 210 of the bracket 21 respectively. Two second engaging elements 216 are disposed on the two opposite side edges of the second sidewall 211 of the bracket 21 respectively. The first engaging element 215 is corresponding to the second engaging element 216. When two expansion bases 20 are assembled with each other, the first engaging elements 215 of one expansion base 20 are engaged with the second engaging elements 216 of the other expansion base 20 respectively.

In an embodiment, as shown in FIGS. 2A, 2B, 5 and 6, the housing 11 of the function body 10 includes a third sidewall 116, a fourth sidewall 117, two third engaging elements 118 and two fourth engaging elements 119. The third sidewall 116 is opposite to the fourth sidewall 117. The two third engaging elements 118 are disposed on two opposite side edges of the third sidewall 116 respectively. The two fourth engaging elements 119 are disposed on two opposite side edges of the fourth sidewall 117. The third engaging element 118 is corresponding to the fourth engaging element 119. When two function bodies 10 are assembled with each other, the third engaging element 118 of one function body 10 is engaged with the fourth engaging element 119 of the other function body 10. When the function body 10 is assembled with the expansion base 20, the third sidewall 116 of the housing 11 and the first sidewall 210 of the bracket 21 are coupled with each other and are coplanar, and the fourth sidewall 117 of the housing 11 and the second sidewall 211 of the bracket 21 are coupled with each other and are coplanar. Meanwhile, the third engaging element 118 is connected and aligned with the first engaging element 215, and the fourth engaging element 119 is connected and aligned with the second engaging element 216.

In an embodiment, as shown in FIGS. 2B and 6, the expansion module 2 includes a plurality of slots 23, and the plural slots 23 are connected and corresponding to the second conducting terminal 222. The slots 23 are partially mounted on the fourth sidewall 117 of the housing 11, and partially mounted on the second sidewall 211 of the bracket 21. While the user handles two adjacent expansion module 2 to achieve the engagement between the first engaging element 215 and the second engaging element 216 and the engagement between the third engaging element 118 and the fourth engaging element 119, the first conducting terminal 221 of one expansion module 2 moves along the slots 23 so as to connect with the second conducting terminal 222 of the other expansion module 2.

Figure 8:
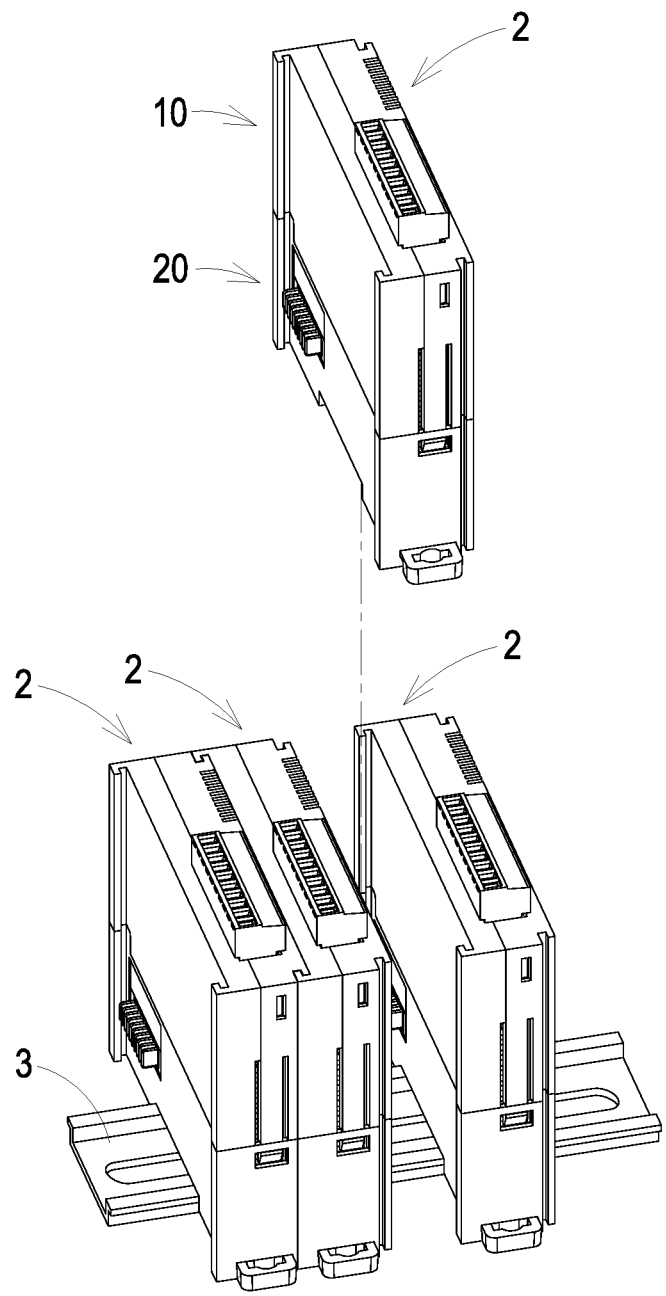
FIG. 8 is a schematic perspective view showing the adjustment to the serial connections within an expansion unit according to another embodiment of the present disclosure.
Figure 9:
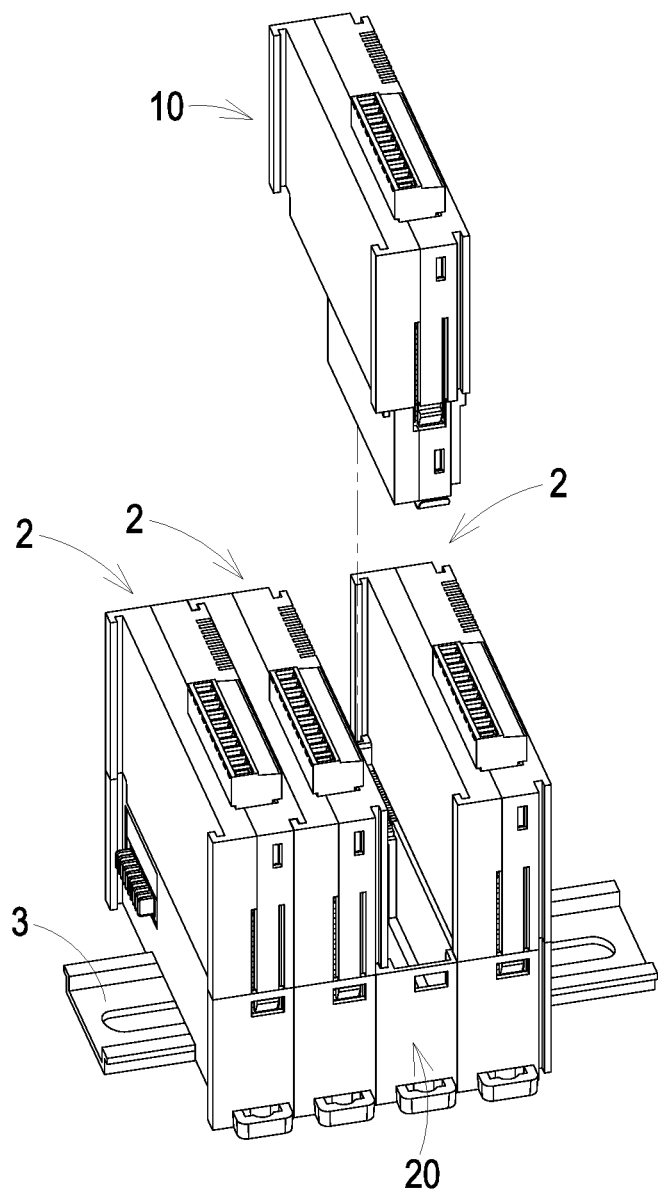
FIG. 9 is a schematic perspective view showing the adjustment to the parallel connections within the expansion unit according to another embodiment of the present disclosure.

In the expansion unit 1 of the programmable logic controller of the present disclosure, the connection between the adjacent expansion bases 20 and the connection between the function body 10 and the expansion base 20 are adjustable. Accordingly, the serial connections and the parallel connections among the plural expansion modules 2 are adjustable. As shown in FIG. 8, for the expansion unit 1 including plural expansion modules 2, the way of adjusting the serial connections is to remove the assembled function body 10 and expansion base 20. Namely, a complete expansion module 2 is removed, and the signal and power transmission between the expansion modules 2 at the two opposite sides of the removed expansion module 2 is interrupted. Consequently, the serial connections among the expansion modules 2 are adjusted. In an embodiment, the interrupted expansion modules 2 are connected with each other via the conducting wires (not shown) and the I/O units 15. As shown in FIG. 9, for the expansion unit 1 including plural expansion modules 2, the way of adjusting the parallel connections is to remove the function body 10 alone and keep the corresponding expansion base 20 connected with the adjacent expansion base 20. Namely, the signal and power transmission among the remaining function bodies 10 is maintained via the expansion bases 20. Consequently, the parallel connections among the expansion modules 2 are adjusted.

In an embodiment, as shown in FIG. 2B, the expansion base 20 includes a locating clip 24. The bracket 21 of the expansion base 20 includes at least one fifth engaging element 217. The locating clip 24 includes at least one sixth engaging element 240 and at least one seventh engaging element 241. The fifth engaging element 217 is corresponding to the sixth engaging element 240. The locating clip 24 and the bracket 21 are assembled with each other by the engagement between the fifth engaging element 217 and the sixth engaging element 240. The seventh engaging element 241 is configured to engage with the rail 3 (as shown in FIGS. 8 and 9). Consequently, the expansion base 20 is detachably assembled with the rail 3.

From the above descriptions, the present invention provides an expansion module of a programmable logic controller. The function body and the expansion base of the expansion module are detachably assembled with each other. The adjacent expansion modules are detachably assembled with each other via the expansion bases, and the base module or the base is no longer needed. Consequently, the number of expansion module is unlimited, which enhances the applicability and decreases the cost, and it is flexible to expand or remove the expansion module during the function variation and the maintenance of the programmable logic controller. In addition, the serial connections and the parallel connections among the expansion modules can be adjusted freely. By removing the function body and expansion base assembled with each other, the serial connections among the expansion modules are adjusted. Alternatively, by removing the function body alone and keeping the corresponding expansion base connected with the adjacent expansion bases, the parallel connections among the expansion modules are adjusted.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An expansion module of a programmable logic controller, the expansion module comprising:

a function body comprising a housing, a circuit board and a first connector, wherein the circuit board is disposed in the housing, and the first connector is connected with the circuit board and is partially exposed from the housing; and an expansion base detachably assembled with the function body, the expansion base comprising:
  a bracket comprising a first sidewall and a second sidewall opposite to the first sidewall, wherein the first sidewall comprises a first opening, and the second sidewall comprises a second opening; and
  a three-way connector detachably disposed in the bracket and comprising a first conducting terminal, a second conducting terminal and a third conducting terminal, wherein the first conducting terminal is at least partially exposed from the bracket through the first opening, the second conducting terminal is at least partially exposed from the bracket through the second opening, and the third conducting terminal is configured to connect with the first connector, wherein when there are plural expansion modules, two adjacent function bodies can be detachably assembled with each other, and two adjacent expansion bases can be detachably assembled with each other.

2. The expansion module according to claim 1, wherein the housing comprises a first component and a second component, and the first component and the second component are assembled together and define an interior space for accommodating the circuit board.

3. The expansion module according to claim 1, wherein the housing comprises a first aperture, and the first connector is exposed from the housing through the first aperture.

4. The expansion module according to claim 1, wherein the housing of the function body comprises at least one first fixing element, the bracket of the expansion base comprises at least one second fixing element, the first fixing element is corresponding to the second fixing element, and the first fixing element is engaged with the second fixing element for assembling the function body and the expansion base with each other.

5. The expansion module according to claim 1, wherein when two adjacent expansion bases are assembled with each other, the first conducting terminal of one expansion base is connected with the second conducting terminal of the other expansion base.

6. The expansion module according to claim 1, wherein the bracket of the expansion base further comprises two first engaging elements and two second engaging elements, the two first engaging elements are disposed on two opposite side edges of the first sidewall, the two second engaging elements are disposed on two opposite side edges of the second sidewall, and the first engaging element is corresponding to the second engaging element, wherein when two expansion bases are assembled with each other, the first engaging element of one expansion base is engaged with the second engaging element of the other expansion base.

7. The expansion module according to claim 6, wherein the housing of the function body further comprises a third sidewall and a fourth sidewall, and the third sidewall is opposite to the fourth sidewall, wherein when the function body is assembled with the expansion base, the third sidewall and the first sidewall are coupled with each other and are coplanar, and the fourth sidewall and the second sidewall are coupled with each other and are coplanar.

8. The expansion module according to claim 7, wherein the function body further comprises two third engaging elements and two fourth engaging elements, the two third engaging elements are disposed on two opposite side edges of the third sidewall, the two fourth engaging elements are disposed on two opposite side edges of the fourth sidewall, and the third engaging element is corresponding to the fourth engaging element, wherein when two function bodies are assembled with each other, the third engaging element of one function body is engaged with the fourth engaging element of the other function body.

9. The expansion module according to claim 8, wherein when the function body is assembled with the expansion base, the third engaging element is connected and aligned with the first engaging element, and the fourth engaging element is connected and aligned with the second engaging element.

10. The expansion module according to claim 1, wherein the function body further comprises a second connector and an I/O (input/output) unit, the housing of the function body comprises a second aperture, the second connector is connected with the circuit board and is aligned with the second aperture, and the I/O unit is connected with the second connector through the second aperture.

11. The expansion module according to claim 1, wherein the expansion base further comprises a locating clip, the bracket of the expansion base further comprises at least one fifth engaging element, the locating clip comprises at least one sixth engaging element and at least one seventh engaging element, the fifth engaging element is corresponding to the sixth engaging element, the locating clip is assembled with the bracket by the engagement between the fifth engaging element and the sixth engaging element, the seventh engaging element is configured to engage with a rail, and thus the expansion base is detachably assembled with the rail.

* * * * *